United States Patent [19]
Uchikoshi

[11] Patent Number: 5,052,032
[45] Date of Patent: Sep. 24, 1991

[54] CLOCK FORMATION CIRCUIT

[75] Inventor: Gohji Uchikoshi, Higashimurayama, Japan

[73] Assignee: Nakamichi Corporation, Kodaira, Japan

[21] Appl. No.: 552,986

[22] Filed: Jul. 16, 1990

[30] Foreign Application Priority Data

Jul. 18, 1989 [JP] Japan .................. 1-185718

[51] Int. Cl.⁵ .............................................. H03D 3/24
[52] U.S. Cl. ...................................... 375/120; 331/17; 331/25
[58] Field of Search .................. 375/106, 119, 120, 20; 331/1 A, 1 R, 15, 17, 18, 25, 27; 360/27, 28, 36.2, 37.1; 328/133

[56] References Cited

U.S. PATENT DOCUMENTS

| | | | |
|---|---|---|---|
| 4,546,329 | 10/1985 | Unger | 331/17 |
| 4,574,254 | 3/1986 | Glance | 331/25 |
| 4,580,100 | 4/1986 | Suzuki et al. | 331/1 A |
| 4,724,401 | 2/1988 | Hogge, Jr. et al. | 331/25 |
| 4,757,279 | 7/1988 | Balzano | 375/120 |
| 4,857,866 | 8/1989 | Tateishi | 331/1 A |
| 4,885,553 | 12/1989 | Hietala | 331/17 |
| 4,901,026 | 2/1990 | Phillips et al. | 328/133 |
| 4,904,958 | 2/1990 | Wyatt | 331/17 |
| 4,929,917 | 5/1990 | Yokogawa et al. | 331/25 |

Primary Examiner—Stephen Chin
Attorney, Agent, or Firm—Pearne, Gordon, McCoy & Granger

[57] ABSTRACT

A clock formation circuit to form from a digital data signal a formation clock signal corresponding to a data clock controlling an inversion timing of the digital data signal having a circuitry which provides an information signal of the phase difference between the digital data signal and the formation clock signal and circuitry which outputs the formation clock signal having a frequency controlled based at least on an integrated information signal obtained by limiting a current flowing through a capacitor having a terminal voltage there across varying in accordance with the phase difference information signal.

6 Claims, 6 Drawing Sheets

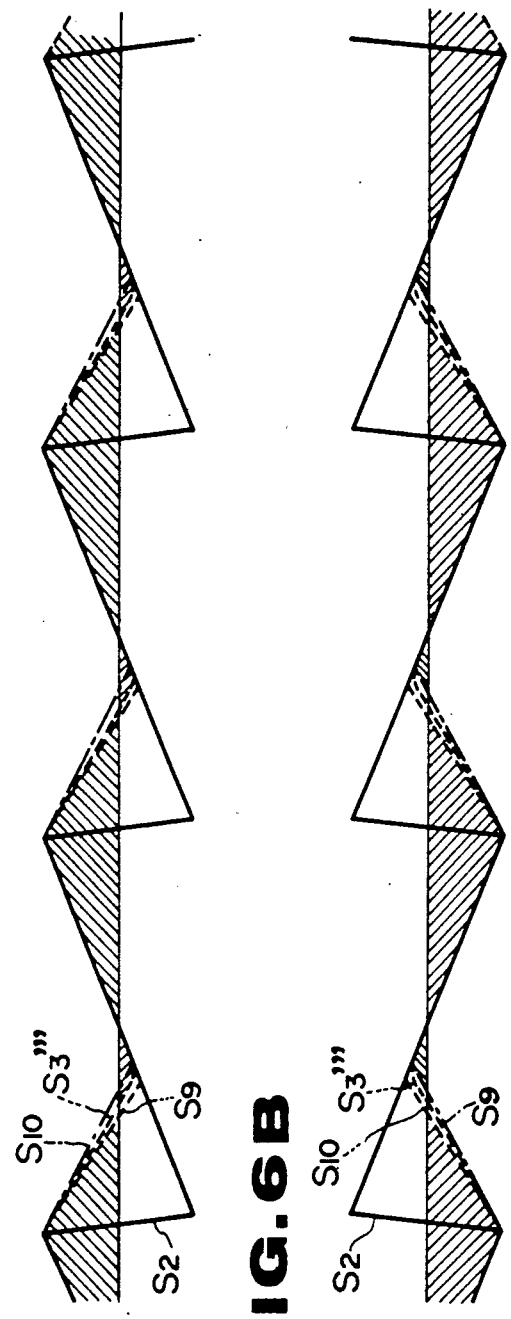

CLOCK FORMATION CIRCUIT

BACKGROUND OF THE INVENTION

A clock formation circuit is used for a digital audio tape recorder (DAT) or a compact disk (CD). Such a clock formation circuit provides a clock signal corresponding to a reference clock signal from a digital data signal.

In the prior art, the clock formation circuit compares a phase of the clock signal to be formed with an inversion timing of the digital data signal and then controls the oscillation frequency of the clock signal so that they are coincidental with each other.

However, the phase comparison is possible only when the frequency difference between the data clock controlling the inversion timing of the digital data signal and the clock signal to be formed falls within the predetermined pulling-in range.

Thus, if the frequency difference falls out of the range, the phase comparison between them is impossible and, therefore, the range for the phase comparison should be narrow.

SUMMARY OF THE INVENTION

Accordingly, it is a principal object of the invention to provide a clock formation circuit adapted to form a formation clock signal so that a phase of a data clock of a digital data signal is coincidental with a phase of the formation clock signal although frequencies of them are much offset.

In accordance with one aspect of the present invention, there is provided a clock formation circuit for forming from a digital data signal a formation clock signal corresponding to a data clock controlling an inversion timing of said digital data signal comprising;

means to provide a phase difference information signal having a level varying in accordance with a phase difference between said digital data signal and said formation clock signal;

a current limitation circuit including a capacitor to input said phase difference information signal and to limit the maximum values of currents introduced into and flowing out of said capacitor, a terminal voltage across said capacitor varies in accordance with said phase difference information signal by its being charged and discharged;

means to output an integrated information signal of said terminal voltage;

and output means to output said formation clock signal having a frequency controlled based at least on said integrated information signal.

In accordance with another aspect of the present invention, there is provided a clock formation circuit for forming from a digital signal a formation clock signal corresponding to data clocks controlling an inversion timing of said digital signal comprising;

means to provide a phase difference information signal having a level varying in accordance with a phase difference between said digital signal and said formation clock signal;

a first charging and discharging circuit comprising first current limitation means including a first capacitor to limit the maximum value of current introduced into said first capacitor although said current is introduced into said first capacitor so that it provides only a level increase in a terminal voltage across said first capacitor and so that said terminal voltage varies in accordance with said phase difference information signal and a first constant current source connected to said first capacitor to flow out a current half as much as said maximum current;

a second charging and discharging circuit comprising second current limitation means including a second capacitor to limit the maximum value of current introduced into said second capacitor, said current is introduced into said second capacitor so that it provides only a level decrease in a terminal voltage across said second capacitor and so that said terminal voltage varies in accordance with said phase difference information signal and a second constant current source connected to said second capacitor to flow out a current half as much as said maximum current;

means to output a total integrated information signal of said terminal voltages across said first and second capacitors;

and output means to output said formation clock signal having a frequency controlled based at least on said total integrated information signal.

BRIEF DESCRIPTION OF THE DRAWINGS

The above and other objects and features of the invention will be apparent from the description of the embodiments of the invention with reference to the accompanying drawings in which:

FIGS. 6A and 6B are similar to FIGS. 5A through 5D, but illustrate principle waveforms of the signals in case of the current limitation circuit of FIG. 2C.

DETAILED DESCRIPTION OF THE EMBODIMENTS

Figure 1:
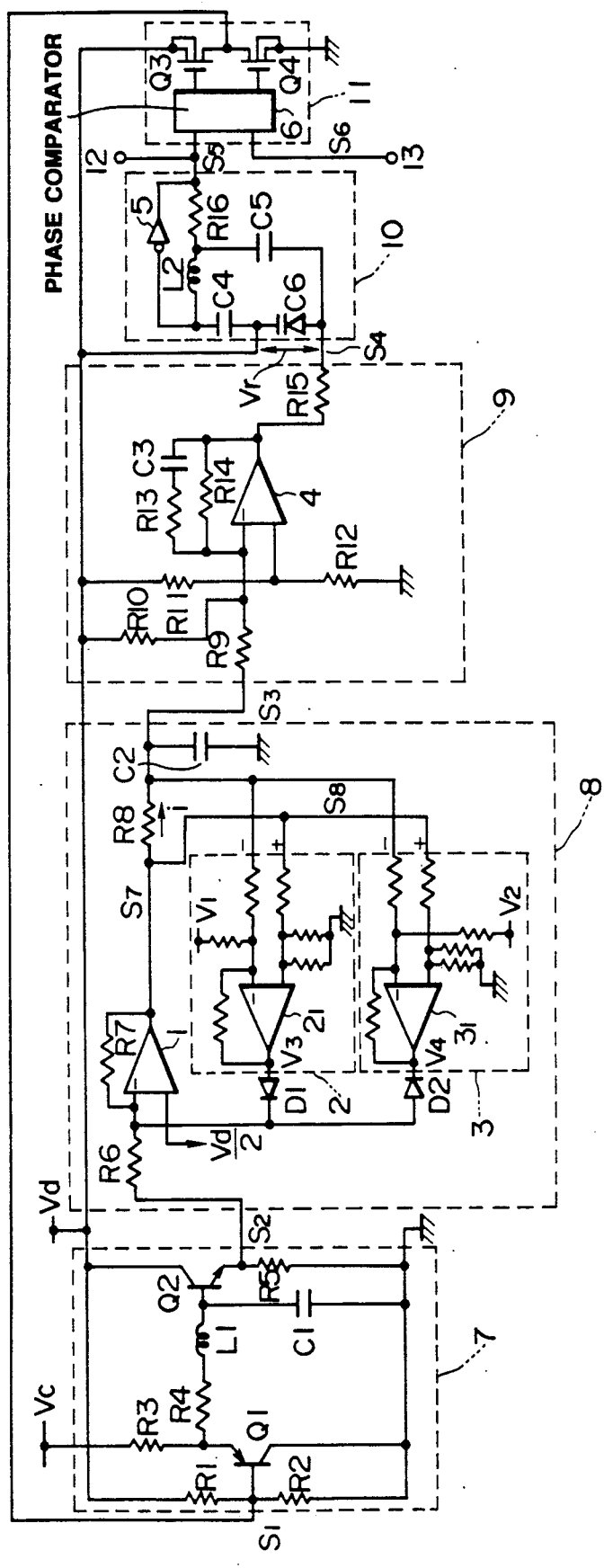
FIG. 1 is a schematic diagram of a clock formation circuit constructed in accordance with one embodiment of the invention.

Referring now to FIG. 1, there is illustrated a clock formation circuit constructed in accordance with one embodiment of the invention. A discrimination pulse signal $s_1$ is applied to a base of a transistor Q1 which is connected to an electric source Vd and to ground through resistors R1 and R2, respectively. The transistor Q1 has a collector connected directly to ground and an emitter connected through a resistor R3 to an electric source Vc and also through a resistor R4 and a coil L1 to a base of a transistor Q2, which is in turn connected through a capacitor C1 to ground.

The transistor Q2 has a collector connected to the electric source Vd and an emitter connected through a resistor R5 to ground and also through a resistor R6 to an inversion input terminal of an operational amplifier 1.

The electric source Vc has a level of voltage fully higher than that of the source voltage Vd.

A secondary lowpass filter 7 is formed by the transistors Q1 and Q2, the resistors R1 through R5, the coil L1 and the capacitor C1 and serves to output a discrimination voltage signal $s_2$ having a level varying in accordance with the pulse width of the discrimination pulse signal $s_1$.

The operational amplifier 1 has a non-inversion input to which a voltage of Vd/2 is applied and an output terminal connected through a resistor R7 to its inversion input terminal and also through resistors R8 and R9 to an inversion input terminal of an operational amplifier 4. Also, the output terminal of the operational amplifier 1 is connected to respective plus input terminals of differential amplifiers 2 and 3. A connection point between the resistors R8 and R9 is connected to a minus input terminal of the differential amplifiers 2 and 3 and through a capacitor C2 to ground. Respective output terminals of the differential amplifiers 2 and 3 are connected to the inversion input terminal of the operational amplifier 1 through diodes D1 and D2 disposed in forward and reverse directions, respectively.

A current limitation circuit 8 is formed by the resistors R6 through R8, the operational amplifier 1, the differential amplifiers 2 and 3, the diodes D1 and D2 and the capacitor C2 and serves to output a polarity discrimination signal $s_3$ described later.

The polarity discrimination signal $s_3$ is input through the resistor R9 to the inversion input terminal of the operational amplifier 4, which is connected through a resistor R10 to the electric source Vd. A non-inversion input terminal of the operational amplifier 4 is connected through resistors R11 and R12 to the electric source Vd and ground, respectively. An output terminal of the operational amplifier 4 is connected to its inversion input terminal through a parallel connection of a resistor R14 and a series connection of a resistor R13 and a capacitor C3 and also connected through a resistor R15 to a connection point of a variable capacitance diode (referred to as varicap here in just below C6 and a capacitor C5.

A correction error detector circuit 9 is formed by the operational amplifier 4, the resistors R9 through R15 and the capacitor C3 and serves to output a correction error information signal $s_4$ described later.

The varicap C6, a capacitor C4, the capacitor C5 and a coil L2 are connected in series to each other and a resistor R16 and an inverter 5 are connected in parallel between terminals of the coil L2. The correction error information signal $s_4$ is applied to a connection point of the varicap C6 and the capacitor C5. A connection point of the varicap C6 and the capacitor C4 is connected to the electric source Vd.

A voltage control oscillator (referred to as VCO here in just below) 10 are formed by the varicap C6, the capacitors C4 and C5, the coil L2, the resistor R16 and the inverter 5 and serves to change an oscillation frequency of a formation clock signal $s_5$ from a connection point between the resistor R16 and the inverter 5 on a capacitance of the varicap C6 varying in accordance with a voltage of the applied correction error information signal $s_4$.

A phase comparator 6 serves to compare a phase of the formation clock signal $s_5$ formed by the VCO 10 and output from an output terminal 12 with that of a digital data signal (referred to as D-data signal here in just below) $s_6$ supplied through an input terminal 13 in accordance with a regulation described later to control field effect transistors (FET) Q3 and Q4 to output the discrimination pulse signal $s_1$ therefrom. A phase comparison circuit 11 is formed by the phase comparators 6 and the FET Q3 and Q4.

An operation of the clock formation circuit of the invention will be described with reference to FIGS. 3 through 5.

Figure 3A:
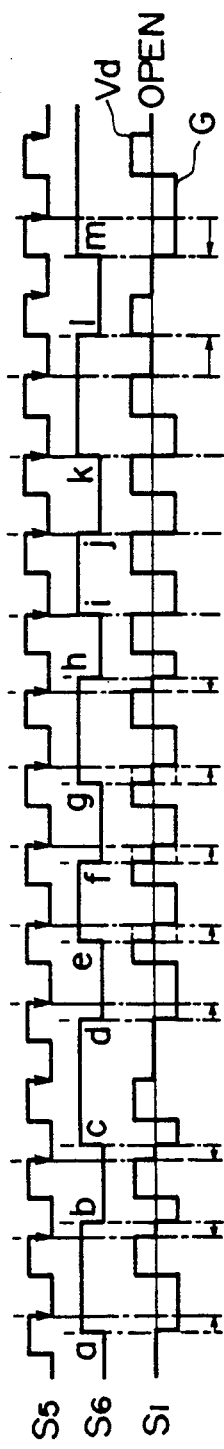
FIGS. 3A through 3C illustrate waveforms of discrimination pulse signals, formation clock signals and D-data signals in accordance with the invention.
Figure 3B:
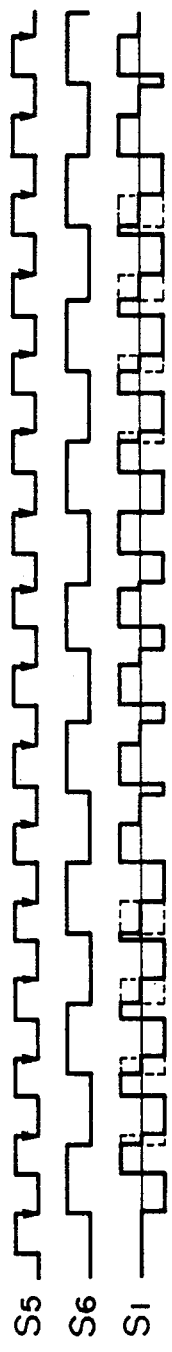
Figure 3C:
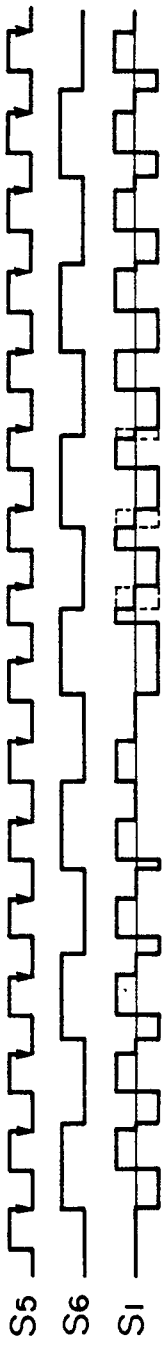

The formation clock signal $s_5$ and the D-data signal $s_6$ having the phases compared with each other by the phase comparison circuit 11 and the discrimination pulse signal $s_1$ formed by the comparison are shown in FIGS. 3A through 3C. It should be noted that the waveforms of the signals are ones in the condition of the output portion of the phase comparison circuit 11 being not connected to the input portion of the lowpass filter 7.

The phase comparison circuit 11 is operated in accordance with the following conditions.

(1) The discrimination pulse signal $s_1$ is at the state of ground level (referred to as "L" level state here in just below) in synchronization with an inversion of state of the D-data signal $s_6$ and is at the state of voltage level of the electric source Vd (referred to as "H" level state herein just below) and at the open state in synchronization with a change from "L" state to "H" state of the next detected formation clock signal $s_5$ and a change from "H" state to "L" state thereof, respectively.

FIG. 3A shows how the discrimination pulse signal $s_1$ occurs in accordance with the aforementioned condition in synchronization with the state inversions a, b and c of the D-data signal $s_6$.

(2) The discrimination pulse signal $s_1$ is at the open state when the state inversion of the following D-data signal $s_6$ is detected before the discrimination pulse signal $s_1$ changes from the "H" level state to the open state while the signals are doubled.

FIG. 3A shows how the discrimination pulse signal $s_1$ occurs in accordance with the aforementioned condition in synchronization with the state inversions d, e, f and g of the D-data signal $s_5$.

(3) The phase comparison circuit 11 is operated in the same manner as the case in which a lowering-down of the D-data signal $s_6$ is previously detected when lowering-down of the D-data signal $s_6$ and raising-up of the formation clock signal $s_5$ are simultaneously detected, while it is operated in the same manner as the case in which raising-up of the formation clock signal $s_5$ is previously detected when raising-up of the D-data signal $s_6$ and raising-up of the formation clock signal $s_5$ are simultaneously detected.

FIG. 3A shows how the discrimination pulse signal $s_1$ occurs in accordance with the aforementioned condition in synchronization with the state inversions l and m of the D-data signal $s_6$.

The "H" level state, the "L" level state and the open state of the discrimination pulse signal $s_1$ are formed by closing and opening the FET Q3 and Q4 by the control of the phase comparator 6, but the description of details thereof will be omitted.

As noted from the figure, a ratio of state time of the discrimination pulse signal $s_1$ supplied on the aforementioned conditions varies in proportion to a difference between the phases on the inversion of state of the D-data signal $s_6$ and on lowering-down of the formation clock signal $s_5$. Thus, it will be noted that the ratio of "H" level state time relative to "L" level state time becomes larger at the advance state of the formed clock signal $s_5$ as indicated by an arrow of leftward direction in FIG. 3A while the ratio of "L" level state time relative to "H" level state time becomes larger at the delay state of the formed clock signal $s_5$ as indicated by an arrow of rightward direction in FIG. 3A. Also, the state inversions i, j and k of the D-data signal $s_6$ as shown in FIG. 3A are coincidental with lowering-down of the formation clock signal $s_5$, and in this case, the ratio of state time of "H" and "L" levels of the discrimination pulse signal $s_1$ becomes equal to each other.

Since the resistors $R_1$ and $R_2$ of the lowpass filter 7 have the same value as each other, the voltage value $Vd/2$ is applied to the base of the transistor $Q_1$ when both of the FET $Q_3$ and $Q_4$ of the phase comparison circuit 11 are at the open state. Thus, the lowpass filter 7 outputs the discrimination voltage signal $s_2$ which is obtained by smoothing the signal of voltage value $Vd/2$ when the discrimination pulse signal $s_1$ is at the open state as shown in FIG. 3.

The operation of the current limitation circuit 8 will be described with reference to FIGS. 4A and 4B, supposed that the resistors $R_6$ and $R_7$ have the same values as each other and that resistors which the differential amplifiers 2 and 3 are formed of have the same values as each other.

While the value of current i flowing through the resistor $R_8$ varies within the predetermined range of $\pm I_0$, the operational amplifier 1 outputs a signal $s_7$ which corresponds to one obtained by inverting a difference $(s_2 - Vd/2)$ between the discrimination voltage signal $s_2$ and the voltage value $Vd/2$ relative to the voltage value $Vd/2$. The positive polarity of the current i flowing through the resistor $R_8$ is supposed to be as indicated by an arrow of FIG. 1.

Figures 4A, 4B:
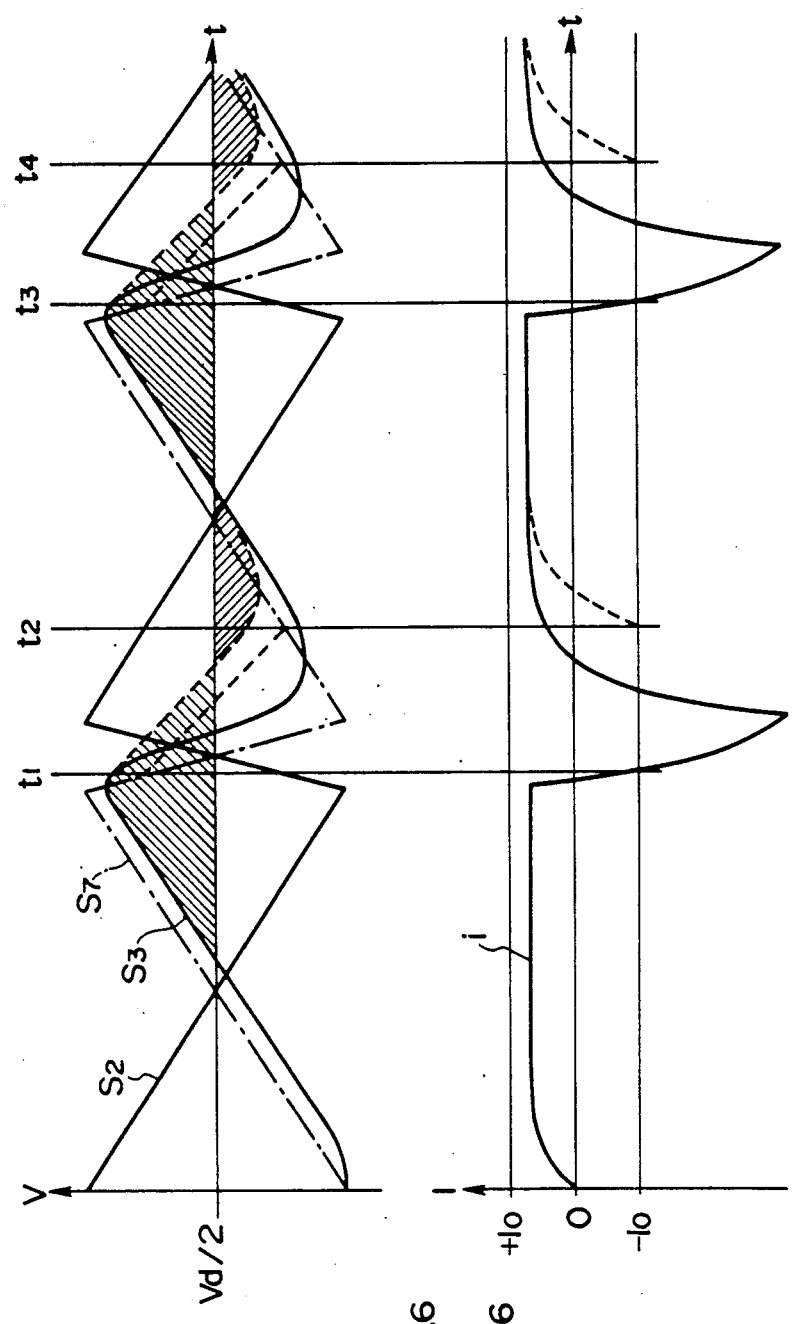
FIG. 4A illustrates a relation of a current flowing through a resistor in the current limitation circuit used for the invention and output voltages of operational amplifiers in the current limitation circuit.
FIG. 4B illustrates waveforms of voltages and currents at various portions of the circuit of the invention.

FIG. 4A shows a relation between the current i and output voltages $V_3$ and $V_4$ from the operational amplifiers $2_1$ and $3_1$. It will be noted that respective values of the output voltages $V_3$ and $V_4$ vary in proportion to the current i. Bias voltages $V_1'$ and $V_2'$ of FIG. 4A are so set as to be swung relative to the voltage value $Vd/2$ by the bias voltages $V_1$ and $V_2$ applied to the operational amplifiers $2_1$ and $3_1$ through their respective resistors.

The current limitation circuit 8 is operated so that if the current i exceeds $+I_0$, then a voltage $V_3$ becomes higher than 0.6 V of a forward voltage of the diode $D_1$ relative to the voltage $Vd/2$ applied to the non-inversion input terminal of the operational amplifier 1, which causes the current to flow from the operational amplifier $2_1$ to the inversion input terminal of the operational amplifier 1. This causes the voltage value of the signal $s_7$ to be lowered so that the current i flowing in a positive direction decreases. Thus, the maximum plus value of the current i is limited approximately to $+I_0$. Similarly, it is operated so that if the current i exceeds $-I_0$, then the current flows from the inversion input terminal of the operational amplifier 1 through the diode $D_2$ to the output terminal of the operational amplifier $3_1$, which causes the voltage value of the signal $s_7$ to be lowered so that the current i flowing in a negative direction decreases. Thus, the maximum minus value of the current i is limited approximately to $-I_0$.

The operation of the current limitation circuit 8 when the discrimination voltage signal $s_2$ varying in a saw tooth wave form relative to the voltage of $Vd/2$ is applied to the current limitation circuit 8 will be described with reference to FIG. 4B showing waveforms of voltages and currents at various portions.

If it is supposed that there are no differential amplifiers 2 and 3 so that the current i is never limited, the voltage of the output signal $s_7$ from the operational amplifier 1 has a waveform corresponding to that of the inverted discrimination voltage signal $s_2$ as indicated by a one dot and chain line in FIG. 4B. The polarity discrimination signal $s_3$ has a waveform varying in a smooth manner at local portions of the signal $s_7$ although it follows the waveform thereof as indicated by a solid line in FIG. 4B. At that time, the current i flowing through the resistor $R_8$ has a waveform varying in an abrupt manner at local portions thereof as indicated by a solid line in FIG. 4B.

The operation when there are provided the differential amplifiers 2 and 3 as shown in FIG. 1 so that the current i is limited to $\pm I_0$ will be described here in just below. As the current i reaches $-I_0$ at time $t_1$, it is limited to $-I_0$ later so as to be maintained at $-I_0$ as indicated by a dot line in FIG. 4B.

Thus, it will be noted that the polarity discrimination signal $s_3$ which is of a terminal voltage of the capacitor $C_2$ decreases at a predetermined rate of variation as indicated by a dot line in FIG. 4B. What this means is that the voltage of the signal $s_7$ is so controlled as to maintained at a difference between the voltage of the signal $s_7$ and the polarity discrimination signal $s_3$ at time $t_1$ after $t_1$ lapses as indicated by a dot line in FIG. 4B.

As there becomes a time $t_2$ when the output signal $s_7$ at the time indicated by the dot line crosses the waveform occuring when the current i is not limited and indicated by the one dot and chain line, the current i again varies within the range of limitation, which causes the voltage of the output signal $s_7$ to again have the waveform indicated by the one dot and chain line. Thus, the polarity discrimination signal $s_3$ varies in a predetermined characteristics as indicated by the dot line so that it follows the output signal $s_7$ after time $t_2$ lapses until it coincides with the waveform of solid line occuring when the current i is not limited. The variation in the current i at that time is indicated by a dot line in FIG. 4B.

Similarly, the same operation is repeated at times $t_3$ and $t_4$ and there occurs the periodical waveform.

In this manner, the polarity discrimination signal $s_3$ output from the current limitation curcuit 8 has a ratio of an area during a time when it is higher than the level of the voltage $Vd/2$ and an area during a time when it is lower than the level of the voltage $Vd/2$ varying in accordance with the waveform of the input discrimination voltage signal $s_2$.

FIG. 4B indicates waveforms of the various portions when the discrimination voltages signal of saw tooth form having its plus variation rate larger than its minus variation rate is input. As noted from this figure, an area where it is higher than the voltage $Vd/2$ of the polarity discrimination signal $s_3$ as indicated by leftward hatching in FIG. 4B is larger than an area where it is lower than the voltage $Vd/2$ of the polarity discrimination signal $s_3$ as indicated by rightward hatching in FIG. 4B. Reversely, when the discrimination voltage signal of saw tooth form having its plus variation rate smaller than its minus variation rate is input, the area where it is lower than the voltage $Vd/2$ of the polarity discrimination signal $s_3$ is larger than an area where it is higher than the voltage $Vd/2$ of the polarity discrimination signal $s_3$ because of the waveforms at the various portions being ones obtained by inverting them relative to an axis of the voltage $Vd/2$ in FIG. 4B.

The correction error detection circuit 9 inputs the polarity discrimination signal $s_3$ having the aforementioned characteristics and serves as an inversion amplifier and an integrator. The correction error detection circuit 9 outputs such a polarity error information signal $s_4$ as that a voltage Vr across the terminals of the varicap C6 becomes a predetermined setting voltage $Vr_1$ when the voltage of the polarity discrimination signal $s_3$ is $Vd/2$ by setting the values of the resistors R11 and R12 to become equal to each other so that the voltage of $Vd/2$ is applied to the non-inversion terminal of the operational amplifier 4 and by setting the value of the resistor R10 at a proper value.

The VCO 10 outputs the formation clock signal $s_5$ having a frequency approximately proportional to the voltage across the terminals of the varicap C6.

The operation of the whole clock formation circuit will be described here in just below.

It is supposed that when the terminal voltage Vr of the varicap C6 is the set voltage $Vr_1$, lowering-down of the formation clock signal $s_5$ from the VCO 10 is coincidental with the state inversion of the D-data signal $s_6$ as indicated by i, j and k of FIG. 3A. At that time, when the phases of both of the signals are coincidental with each other, the discrimination pulse signal $s_1$ has a ratio of times when it is at "H" and "L" level states equal to each other. Thus, both of the discrimination voltage signal $s_2$ having a ripple removed by the lowpass filter 7 and the polarity discrimination signal $s_3$ have a constant value of voltage $Vd/2$. Thus, the terminal voltage Vr of the varicap C6 is maintained at the set voltage $Vr_1$ so that the formation clock signal $s_5$ and the D-data signal $s_6$ are kept in synchronization with each other. A frequency fr of the formation clock signal $s_5$ at that time is called a set frequency $fr_1$.

As a distance between state inversions of the D-data signal $s_6$ becomes shorter from this condition, the D-data signal $s_6$ has the phase advancing relative to that of the formation clock signal $s_5$ and a ratio of time when the discrimination pulse signal $s_1$ is at "L" level state as indicated by a rightward arrow of FIG. 3A is larger. As a result, the voltage level of the discrimination voltage signal $s_2$ is lower from and than the level of $Vd/2$ while the voltage level of the polarity discrimination signal $s_3$ is higher from and than the level of $Vd/2$.

If it is supposed that the operation of the correction error detection circuit 9 as the integrator is neglected, then the frequency fr of the formation clock signal $s_5$ is higher than the set frequency $fr_1$ because of the terminal voltage Vr of the varicap C6 being higher than the set voltage $Vr_1$ so that a difference between the phases of the signals $s_5$ and $s_6$ follows so as to maintain a predetermined relation between them. The difference between the phases at this time is such one as the level of the polarity discrimination signal $s_3$ is brought to increase in a degree necessary for generating the frequency of the formation clock signal $s_5$ when it is higher than the set frequency $fr_1$.

Thus, it will be noted that although, in case of the operation of the correction error detection circuit 9 as the integrator being neglected, the circuit of FIG. 1 will be operated so that the frequency of the formation clock signal $s_6$ varies in accordance with variation in the frequency of the D-data signal $s_5$ and the difference between the phases of the signals is maintained at a predetermined value, the phase of the formation clock signal $s_5$ relative to that of the D-data signal $s_6$ is delayed in approximate proportion to an offset of the frequency in case of the frequency fr of the formation clock signal $s_5$ being higher than the set frequency $fr_1$, and is advanced in the case of the frequency fr being lower than the set frequency $fr_1$.

Next, the operation of the circuit of FIG. 1 will be described here in just below in view of the operation of the correction error detection circuit 9 as the integrator.

As the phase of the D-data signal $s_6$ begins to advance relative to that of the formation clock signal $s_5$ as aforementioned, the level of the correction error detection circuit $s_4$ becomes lower so that the frequency fr of the formation clock signal $s_5$ becomes higher whereby it follows that of the D-data signal $s_6$ rapidly. However, while the phase of the D-data signal $s_6$ advances and therefore while the voltage level of the polarity descrimination signal $s_3$ is higher than $Vd/2$, the level of the correction error information signal $s_4$ is lowered at a rate of variation proportional to the difference between the levels of them. This corrects the frequency of the formation clock signal $s_5$ while the phase difference occurs. When there is no phase difference so that the discrimination signal $s_3$ becomes $Vd/2$, the correction error information signal $s_1$ becomes constant and is kept at its level.

It will be noted that although the circuit of FIG. 1 is operated so that the difference between the phases of them is maintained at a constant value in case of the operation of the correction error detection circuit 9 as the integrator being neglected, there occurs a difference between the phases of them in accordance with the frequency fr of the formation clock signal $s_5$. The correction error detection circuit 9 is operated as the integrator so that it corrects the error whereby there occurs no difference between the phases thereof.

The operation will be described here in just below in case of a frequency of an imaginary clock (referred to as data clock here in just below) controlling an inversion timing of the D-data signal $s_6$ and the frequency of the formation clock signal $s_5$ being offset from each other.

FIG. 3B shows how the discrimination pulse signal $s_1$ varies in case of the frequency of the data clock of the D-data signal $s_6$ being higher than that of the formation clock signal $s_5$. It will be apparent from this figure that the phase of the formation clock signal $s_5$ is gradually delayed relative to that of the D-data signal $s_6$ in more degrees and that the former is considered to be advanced after it is delayed at more than 180 degrees. Thereafter, the phase of the formation clock signal $s_5$ is gradually advanced in less degrees and is changed so that it is again delayed. Thus, such a change of the phase conditions of the formation clock signal $s_5$ is repeated. Thus, the discrimination voltage signal $s_2$ obtained by removing high range frequency components from the discrimination pulse signal $s_1$ by the lowpass filter 7 has a waveform similar to a sawtooth wave as indicated in FIG. 4B. Thus, the polarity discrimination signal $s_3$ from the current limitaion circuit 8 also has a waveform similar to a waveform including a dot line portion as indicated in FIG. 4B.

FIGS. 5A through 5D indicate principle waveforms of the signals $s_2$, $s_3$ and $s_7$ for understanding the relation of the signals in case of the phases of the data clock of the D-data signal $s_6$ and the formation clock signal $s_5$ being offset from each other.

Figure 5A:
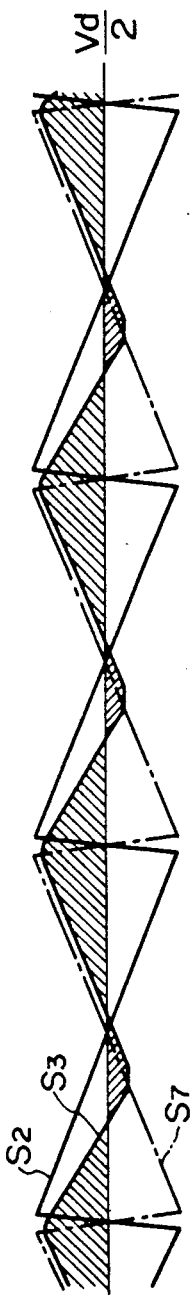
FIGS. 5A through 5D illustrate principle waveforms of the signals in case of the frequencies of the D-data signal and the formation clock signal.
Figure 5B:
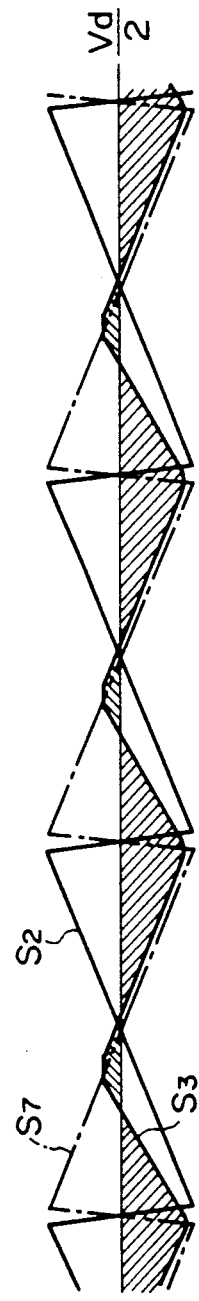

It will be understood from the aforementioned description that the discrimination voltage signal $s_2$ has a waveform similar to a sawtooth waveform as indicated in FIG. 5A in case of the frequency of the data clock of the D-data signal $s_6$ higher than the frequency of the formation clock signal $s_5$. In this case, as noted from the description of FIG. 4B, an area where the polarity discrimination signal $s_3$ is higher than the voltage $Vd/2$ as indicated by leftward haching in FIG. 5B is larger than an area where it is lower than the voltage $Vd/2$ as indicated by rightward hatching. Thus, the voltage level of the correction error information signal $s_4$ decreases during this condition by the integrating operation of the correction error detection circuit 9 so that the terminal voltage of the varicap C6 becomes higher whereby the frequency of the formation clock signal $s_5$ becomes higher until it approaches the frequency of the data clock.

FIG. 3C shows how the discrimination pulse signal $s_1$ varies in case of the frequency of the data clock of the D-data signal $s_6$ being lower than that of the formation clock signal $s_5$. In this case, since the discrimination voltage signal $s_2$ has a waveform similar to a sawtooth waveform as indicated in FIG. 5B, an area where the polarity discrimination signal $s_3$ is higher than the voltage $Vd/2$ as indicated by leftward haching in FIG. 5B is smaller than an area where it is lower than the voltage $Vd/2$ as indicated by rightward hatching. Thus, the voltage level of the correction error information signal $s_4$ increases during this condition by the integrating operation of the correction error detection circuit 9 so that the terminal voltage of the varicap C6 becomes lower whereby the frequency of the formation clock signal $s_5$ becomes lower until it approaches the frequency of the data clock.

Figure 5C:
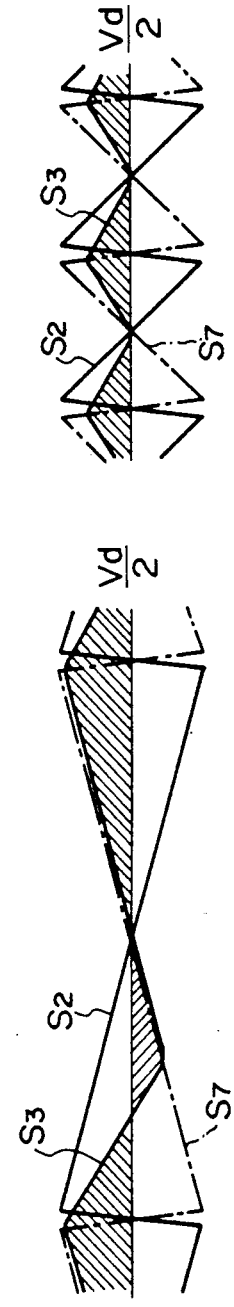
Figure 5D:
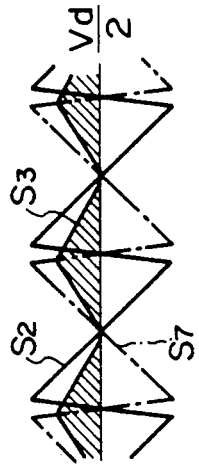

FIGS. 5C and 5D show how the discrimination voltage signal $s_2$ varies in case of the frequency of the formation clock signal $s_5$ being lower than that of the data clock of the D-data signal $s_6$.

As indicated in FIG. 5C, in case of a difference between the phases being smaller, the period of the sawtooth waveform is longer, but there is no variation in the respective areas aforementioned. As indicated in FIG. 5D, in case of the difference between the phases being larger, the period of the saw tooth waveform is shorter. In this case, since the current limitation curcuit 8 limits the current while the voltage level of the polarity discrimination signal $s_3$ is increasing and also while it is decreasing, the rate of increase is identical to the rate of decrease except for the local portions. Thus, as noted from FIG. 5D, the polarity discrimination signal $s_3$ varies relative to a level higher than the voltage $Vd/2$ so that an increase time is approximately identical to a decrease time and as a result the same effect is obtained.

As noted from the aforementioned description, the circuit of FIG. 1 is so operated that it controls the frequency of the formation clock signal $s_5$ whereby the frequencies of the date clock and the formation clock signal $s_5$ are coincidental with each other when they are different from each other and so that the phases of them are coninicidental with each other when they are offset from each other.

Figure 2C:
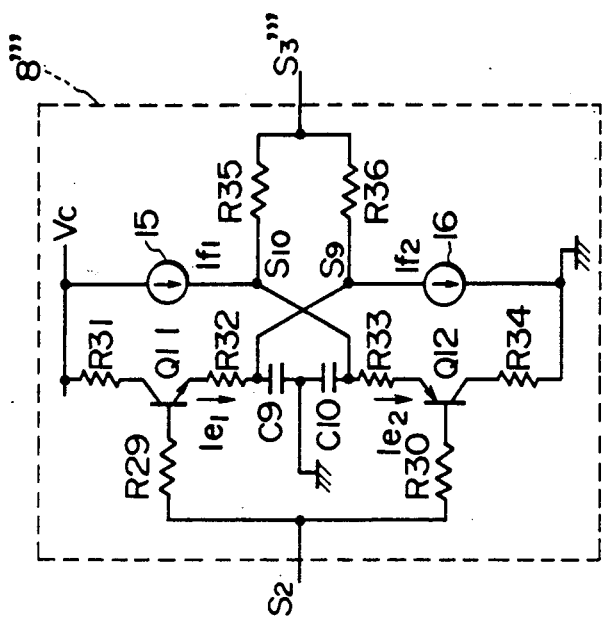
FIGS. 2A through 2C are schematic diagrams of some modifications of a current limitation circuit used for the invention.
Figure 2B:
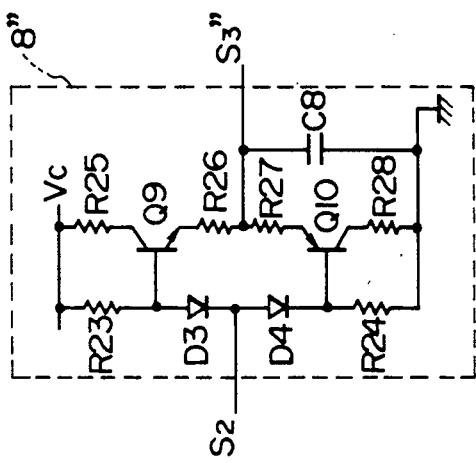
Figure 2A:
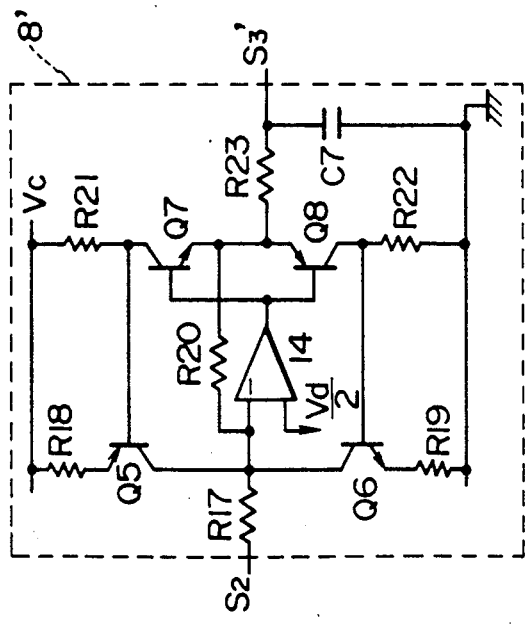

FIGS. 2A through 2C show modifications of the current limitation circuits used for the invention.

In a current limitation circuit 8' of FIG. 2A, transistors Q7 and Q8 connected to an output terminal of an operational amplifier 14 output an inversion signal of the input discrimination voltage signal $s_2$ to emitters thereof, but the maximum values of the currents flowing through the respective transistors are limited. More particularly, the current introduced into a capacitor C7 is controlled by the transistor Q7, but a transistor Q5 is turned on by more than a predetermined value of voltage drop across a resistor R21 to lower an output voltage of the operational amplifier 14 so that the current introduced into the capacitor C7 is limited. Similarly, the current flowing out of the capacitor C7 is controlled by a transistor Q8, but a transistor Q6 is turned on by more than a predetermined value of voltage drop across a resistor R22 to heighten an output voltage of the operational amplifier 14 so that the current flowing out of the capacitor C7 is limited. Thus, a relation between the discrimination voltage signal $s_2$ input by the current limitation circuit 8' and the polarity discrimination signal $s_3'$ output by the current limitation circuit 8' is identical to that of the waveforms indicated in FIGS. 5A through 5D.

In a current limitation circuit 8" of FIG. 2B, transistors Q9 and Q10 try to output to a connection point of resistors R26 and R27 connected to emitters thereof a signal having the same phase and the same level as those of the discrimination voltage signal $S_2$ input through diodes D3 and D4, but they are operated within a saturation range by voltage drop across resistors R25 and R28 connected to respective collectors thereof so that the value of current introduced into and flowing out of a capacitor C8 is limited. Thus, a relation between the discrimination voltage signal $S_2$ input by the current limitation circuit 8" and the polarity discrimination signal $S_3''$ output by the current limitation circuit 8" is similar to that of the waveforms indicated in FIGS. 5A through 5D, but because of the current limitation circuit 8" being in the form of a non-inversion circuit, the polarity discrimination signal $S_3''$ has a waveform obtained by inverting relative to an axis of the level of the voltage $Vd/2$ the polarity discrimination signal $S_3$ indicated in FIGS. 5A through 5D.

In a current limitation circuit 8''' of FIG. 2C, the input discrimination voltage signal $S_2$ is applied through resistors R29 and R30 to bases of transistors Q11 and Q12. Collectors of the transistors Q11 and Q12 are connected through resistors R31 and R34 to the electric source Vc and ground, respectively. An emitter of the transistor Q11 is connected to ground through a resistor R32 and a capacitor C9 while an emitter of the transistor Q12 is connected to ground through a resistor R33 and a capacitor C10. A connection point of the resistor R32 and the capacitor C9 is connected through a current source 15 to the electric source Vc and also connected to an output portion through a resistor R35. The values of the resistors R31 and R34 are so set that the transistors Q11 and Q12 are operated within the saturation range when emitter currents $Ie_1$ and $Ie_2$ of the transistors Q11 and Q12 become approximately twice as much as currents $If_1$ and $If_2$ from the current sources 16 and 15. It is supposed that the currents $If_1$ and $If_2$ have the same values while the capacitors C9 and C10 have the same values.

As indicated in FIG. 6A, the waveform of the discrimination voltage signal $S_2$ is similar to a sawtooth waveform. In case of a rate of level decrease of the discrimination voltage signal $S_2$ being larger than a rate of level decrease $\alpha_1$ determined by the values of the capacitor C9 and the current $If_2$, the transistor Q11 is turned off so that the level of the terminal voltage signal $S_9$ of the capacitor C9 decreases with the rate of level decrease $\alpha_1$ as indicated in FIG. 6A. Since the emitter current $Ie_2$ of the transistor Q12 is limited to approximately twice as much as the current $If_2$, the level of the terminal voltage signal $S_{10}$ of the capacitor C10 decreases with the rate of level decrease α. These decreases of levels continue until the levels of the signals $S_9$ and $S_{10}$ become equal to the level of the discrimination voltage signal $S_2$ which is changed to increase. In case of a rate of level increase of the discrimination voltage signal $S_2$ being smaller than a rate of level increase $\alpha_2$ determined by the values of the capacitor $C_{10}$ and the current $If_1$ and having the same absolute value as that of the rate of level decrease $\alpha_1$, the levels of the terminal voltage signals $S_9$ and $S_{10}$ of the capacitors $C_9$ and $C_{10}$ increase with the similar rate of level increase of the discrimination voltage signal $S_2$ as indicated in FIG. 6A. Thus, the level of the polarity discrimination signal $S_3'''$ output from the current limitation circuit $8'''$ is equal to $(S_9 + S_{10})$ under the condition of the values of the resistors R35 and R36 are equal to each other and varies as indicated by a dot line in FIG. 6A so that an area where it is higher than the voltage Vd/2 as indicated by leftward hatching is larger than an area where it is lower as indicated by rightward hatching. It is noted that an output impedance thereof is so set to be half as much as the value of the resistor R36.

FIG. 6B indicates the waveforms of the signals $S_9$, $S_{10}$ and $S_3'''$ in case of the sawtooth waveform of the input discrimination voltage signal $S_2$ being reversed. At that time, the rate of areas is also reversed and the operation thereof will be omitted because it is apparent.

It will be noted that the current limitation circuit 8' of FIG. 2A can be used in place of the current limitation circuit 8 of FIG. 1 because of its inversion type, but the current limitation circuits 8" and 8''' of FIGS. 2B and 2C can be used in place of the current limitation circuit of FIG. 1 by properly correcting the other portions of the circuits of FIG. 1 because of its non-inversion type. For example, the resistor R10 of the correction error detection circuit 9 should connected to ground rather than connected to the electric source Vd and the resistor R15 should be connected to a connection point of the varicap C6 and the capacitor C4 of the VCO 10 rather than connected to the connection point of the varicap C6 and the capacitor C5. Furthermore, the connection point of the varicap C6 and the capacitor C4 is not connected to the electric source, but the connection point of the varicap C6 and the capacitor C5 is connected to ground. The thus corrected clock formation circuit can be operated in a desired manner.

It will be noted that a signal inversion circuits for inverting the signals relative to the voltage level Vd/2 may be disposed in front stages of the circuits 8 or 9 in place of the aforementioned correction.

Although some preferred embodiments of the invention have been described and illustrated with reference to the accompanying drawings, it will be understood by those skilled in the art that they are by way of examples, and that various changes and modifications may be made without departing from the spirit and scope of the invention, which is intended to be defined by the appended claims.

What is claimed is:

1. A clock formation circuit for forming from a digital data signal a formation clock signal corresponding to a data clock signal controlling an inversion timing of said digital data signal comprising:
   means to compare a phase of said digital data signal with a phase of said formation clock signal and to provide a phase difference information signal having a sawtooth period waveform when a frequency of said data clock signal is different from a frequency of said formation clock signal, said phase difference information signal having a level varying in accordance with a phase difference between said digital data signal and said information clock signal;
   a current limitation circuit including a capacitor to input said phase difference information signal and to limit the maximum values of currents introduced into and flowing out of said capacitor, a terminal voltage across said capacitor varies in accordance with said phase difference information signal by its being charged and discharged;
   means to output an integrated information signal of said terminal voltage;
   and output means to output said formation clock signal having a frequency controlled based at least on said integrated information signal.

2. A clock formation circuit as set forth in claim 1, and wherein said current limitation circuit comprises an operational amplifier having an output terminal connected to said capacitor, an inversion input terminal connected in parallel through reversely forwarded diodes to two differential amplifiers, respectively and a non-inversion terminal to which a reference voltage is applied.

3. A clock formation circuit as set forth in claim 1, and wherein said current limitation circuit comprises an operational amplifier having an inversion terminal to which said phase difference information signal is applied through a resistor and an output terminal which is connected to respective bases of a pair of transistors having emitters connected to each other, a resistor connected between said inversion terminal of said operational amplifier and respective emitters of said transistors, a capacitor connected through a resistor to said emitters of said transistors, a pair of resistors connected to respective collectors of said pair of transistors and a pair of current adjusting circuits to adjust a current to said inversion input terminal in accordance with a value of the current flowing through said pair of resistors.

4. A clock formation circuit as set forth in claim 1, and wherein said current limitation circuit comprises two transistors having emitters connected to each other and to said capacitor, collectors connected through resistors between a voltage source and bases to which said phase difference information signal is applied through reversely forwarded diodes.

5. A clock formation circuit for forming from a digital signal a formation clock signal corresponding to data clocks controlling an inversion timing of said digital signal comprising:
   means to provide a phase difference information signal having a level varying in accordance with a phase difference between said digital signal and said formation clock signal;
   a first charging and discharging circuit comprising first current limitation means including a first capacitor to limit a first maximum value of current introduced into said first capacitor, said current introduced into said first capacitor providing only a level increase in a terminal voltage across said first capacitor and so that said terminal voltage varies in accordance with said phase difference information signal and a first constant current source connected to said first capacitor to flow out a current half as much as said first maximum current;

a second charging and discharging circuit comprising second current limitation means including a second capacitor to limit to a second maximum value of current introduced into said second capacitor, said current introduced into said second capacitor providing only a level decrease in a terminal voltage across said second capacitor and so that said terminal voltage across said second capacitor varies in accordance with said phase difference information signal and a second constant current source connected to said second capacitor to flow out a current half as much as said second maximum current;

means to output a total integrated information signal of said terminal voltages across said first and second capacitors;

and output means to output said formation clock signal having a frequency controlled based at least on said total integrated information signal.

6. A clock formation circuit as set forth in claim 5, and wherein said first charging and discharging circuit comprises a first transistor having a base to which said phase difference information signal is applied and an emitter connected to said first capacitor and also connected through said first constant current source to ground while said second charging and discharging circuit comprises a second transistor having a base to which said phase difference information signal is applied and an emitter connected to said second capacitor and also connected through said second constant current source to a voltage source.

* * * * *